United States Patent
Liang

(10) Patent No.: US 8,616,382 B2
(45) Date of Patent: Dec. 31, 2013

(54) SERVER RACK

(75) Inventor: An-Gang Liang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 14 days.

(21) Appl. No.: 13/525,375

(22) Filed: Jun. 18, 2012

(65) Prior Publication Data

US 2013/0220953 A1 Aug. 29, 2013

(30) Foreign Application Priority Data

Feb. 29, 2012 (CN) .......................... 2012 1 0048714

(51) Int. Cl.
*H05K 5/00* (2006.01)
(52) U.S. Cl.
USPC ............................ 211/26; 312/265.1; 361/724
(58) Field of Classification Search
USPC ............. 211/26, 26.2, 126.15, 175, 183, 189, 211/190, 191, 206, 207, 208; 248/220.21, 248/220.31, 220.42, 222.52, 224.8, 225.21; 312/223.1, 265.1, 265.2, 265.3, 265.4, 312/334.4, 334.5; 361/724, 725
See application file for complete search history.

(56) References Cited

U.S. PATENT DOCUMENTS

| | | | | | |
|---|---|---|---|---|---|
| 2,710,784 | A | * | 6/1955 | Morin | 312/351.8 |
| 4,106,630 | A | * | 8/1978 | Rosenband | 211/191 |
| 4,261,470 | A | * | 4/1981 | Dolan | 211/191 |
| 5,887,733 | A | * | 3/1999 | Harvey et al. | 211/182 |
| 5,961,243 | A | * | 10/1999 | Michaluk, III | 403/260 |
| 6,036,290 | A | * | 3/2000 | Jancsek et al. | 312/265.4 |
| 6,155,434 | A | * | 12/2000 | Benner et al. | 211/26.2 |
| 6,238,028 | B1 | * | 5/2001 | Benner et al. | 312/265.3 |
| 6,364,141 | B1 | * | 4/2002 | Ehrgott | 211/189 |
| 6,431,668 | B1 | * | 8/2002 | Reddicliffe | 312/334.5 |
| 6,516,955 | B1 | * | 2/2003 | Dudhwala et al. | 211/26 |
| 6,600,656 | B1 | * | 7/2003 | Mori et al. | 361/724 |
| 6,968,962 | B2 | * | 11/2005 | Toma | 211/182 |
| D603,628 | S | * | 11/2009 | Towater et al. | D6/491 |
| D604,065 | S | * | 11/2009 | Towater et al. | D6/491 |
| 7,878,468 | B2 | * | 2/2011 | Chen et al. | 248/220.41 |
| 8,092,115 | B1 | * | 1/2012 | McLeod et al. | 403/408.1 |
| 8,297,450 | B2 | * | 10/2012 | Zavidniak et al. | 211/13.1 |
| 8,322,668 | B2 | * | 12/2012 | Tang et al. | 248/222.14 |
| 2002/0158556 | A1 | * | 10/2002 | Cheng | 312/333 |
| 2003/0193781 | A1 | * | 10/2003 | Mori | 361/725 |
| 2005/0174020 | A1 | * | 8/2005 | Francisquini | 312/265.3 |
| 2005/0285492 | A1 | * | 12/2005 | Hu et al. | 312/334.4 |
| 2005/0285493 | A1 | * | 12/2005 | Hu et al. | 312/334.4 |
| 2007/0247044 | A1 | * | 10/2007 | Adams et al. | 312/334.5 |
| 2009/0236957 | A1 | * | 9/2009 | Hudz et al. | 312/265.4 |
| 2011/0290967 | A1 | * | 12/2011 | Ringenbach et al. | 248/220.1 |
| 2012/0068031 | A1 | * | 3/2012 | Phelan et al. | 248/224.8 |

* cited by examiner

*Primary Examiner* — Joshua Rodden
(74) *Attorney, Agent, or Firm* — Altis & Wispro Law Group, Inc.

(57) ABSTRACT

A server rack includes a rectangular rack frame, and two mounting brackets. The rack frame includes four support posts. Each post includes a side attachment flange parallel to a lengthwise direction of the rack frame, and an end attachment flange parallel to a transverse direction of the rack frame. The rack frame defines an access in a front of the rack frame for a server unit sliding into or out of the rack frame. Each of the mounting brackets can be selectively fixed between the side attachment flanges of the corresponding support posts to support the server unit, or between the end attachment flanges of the corresponding support posts to shield the access, thereby preventing air from flowing through the access to decrease heat dissipation efficiency.

1 Claim, 5 Drawing Sheets

SERVER RACK

BACKGROUND

1. Technical Field

The present disclosure relates to a server rack.

2. Description of Related Art

Rack-mount server systems include a server rack and a plurality of server units received in the server rack. Each of the server units is mounted to the server rack with a pair of mounting brackets respectively fixed to the insides of opposite sidewalls of the server rack. When a server unit is removed from the server rack to leave a space in the server rack, an air blocking cover has to be prepared to cover an opening in an access of the server rack communicating with the hollow space, for preventing air flowing through the hollow space and decrease heat dissipation efficiency. In the other hand, the mounting brackets corresponding to the removed server unit are idle, and cannot be made full use of.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
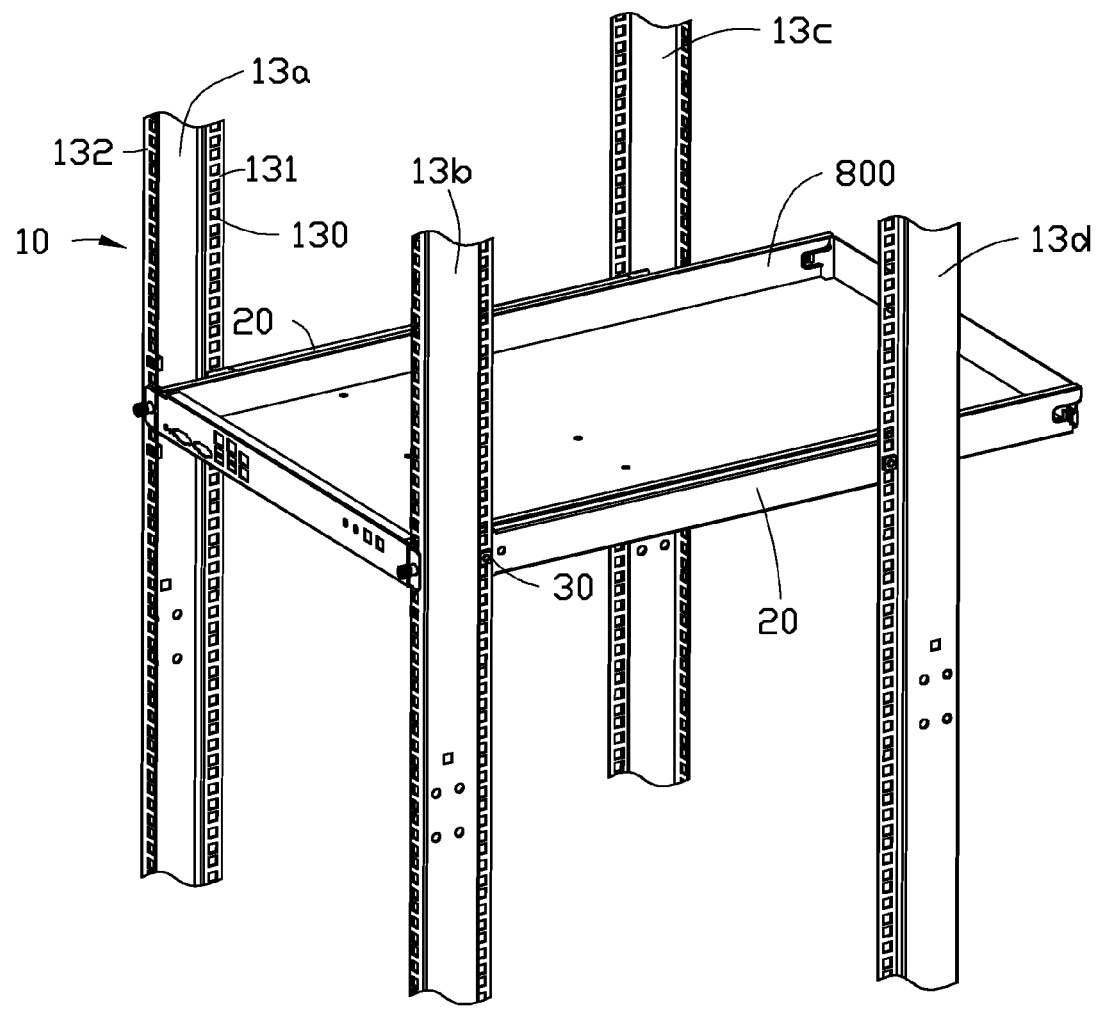
FIG. 1 is an isometric, assembled view of an exemplary embodiment of a server rack, and a server unit, wherein the server rack includes a rack frame, a pair of mounting brackets, and a plurality of fasteners.
Figure 3:
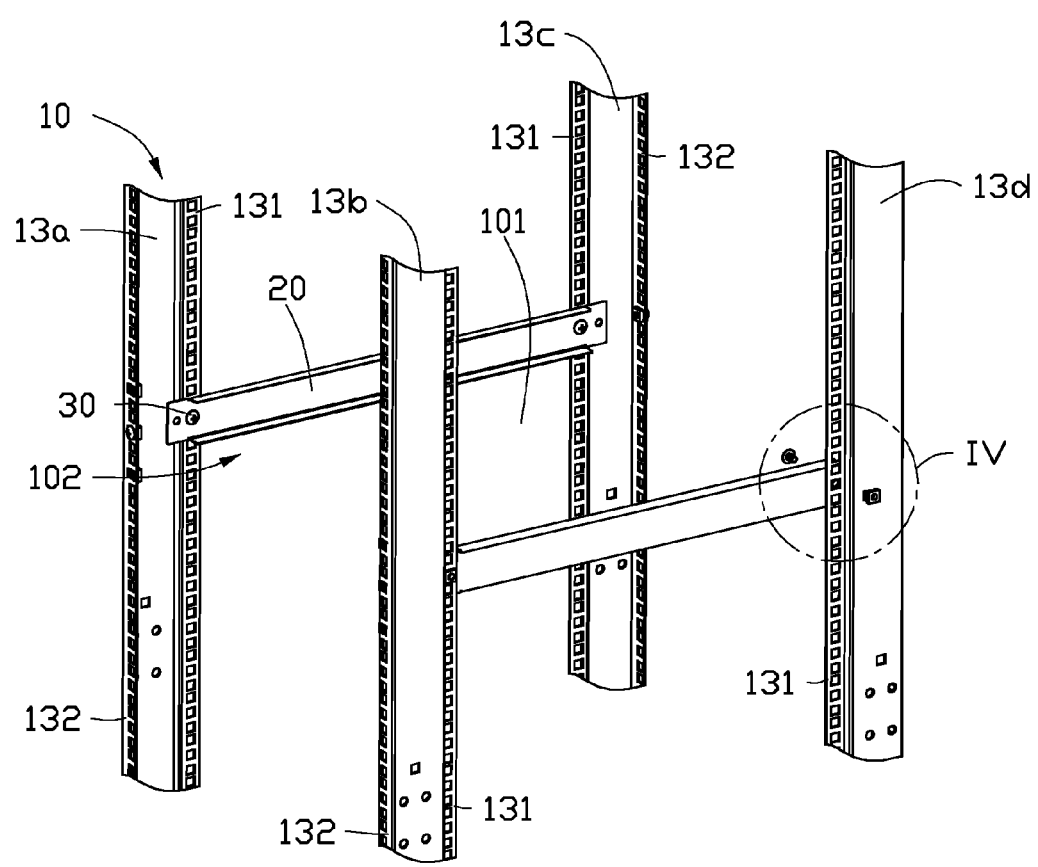
FIG. 3 is an isometric, assembled view of the server rack of FIG. 1, showing the mounting brackets at a first assembly position.

Referring to FIGS. 1 and 3, an exemplary embodiment of a server rack includes a rack frame 10, a pair of mounting brackets 20, and a plurality of fasteners 30. The rack frame 10 includes four support posts, respectively labeled as 13a, 13b, 13c, and 13d, which are cooperatively bounding a rectangular space 101 to accommodate a plurality of server units. Only one server unit 800 is shown in FIG. 1. The support posts 13a and 13b are arranged in front of the support posts 13c and 13d, and respectively array with the support posts 13c and 13d along a lengthwise direction of the rack frame 10. The support posts 13a and 13c correspondingly align with the support posts 13b and 13d in a transverse direction of the rack frame 10. An access 102 in defined between the support posts 13a and 13b, through which the server unit 800 is slid into or out of the rack frame 10.

Each of the support posts 13a-13d includes a side attachment flange 131 parallel to the lengthwise direction of the rack frame 10, and an end attachment flange 132 parallel to the transverse direction of the rack frame 10. Each of the side attachment flanges 131 and the end attachment flanges 132 defines a plurality of positioning holes 130.

Figure 2:
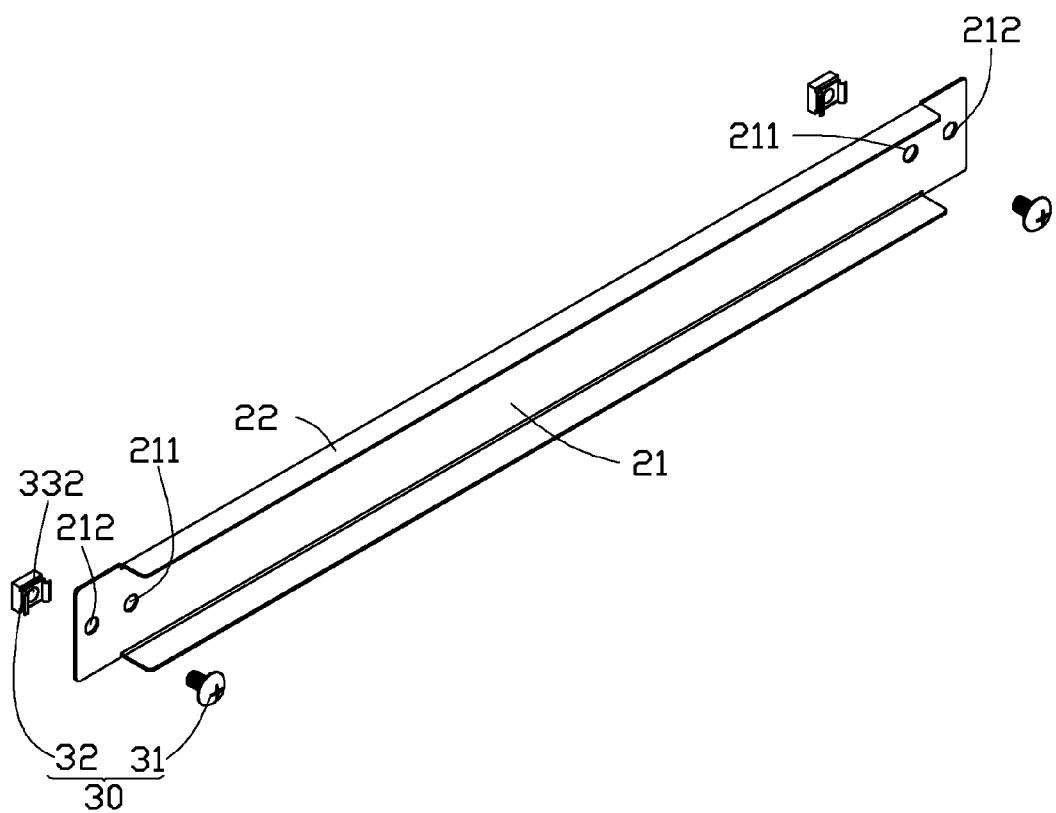
FIG. 2 is an isometric, exploded view of one of the mounting brackets, and the corresponding fasteners of FIG. 1.

Referring to FIG. 2, each of the mounting brackets 20 includes a rectangular base plate 21, and two side plates 22 respectively extending from opposite sides of the base plate 21 in a substantially perpendicular manner Two first fixing holes 211 are defined in the base plate 21, respectively adjacent to opposite ends of the base plate 21. Two second fixing holes 212 are defined in the base plate 21, and arranged at outer sides of the corresponding first fixing holes 211.

In one embodiment, each of the fasteners 30 includes a screw 31, and an abutting block 32 defining a threaded hole 332.

Figure 4:
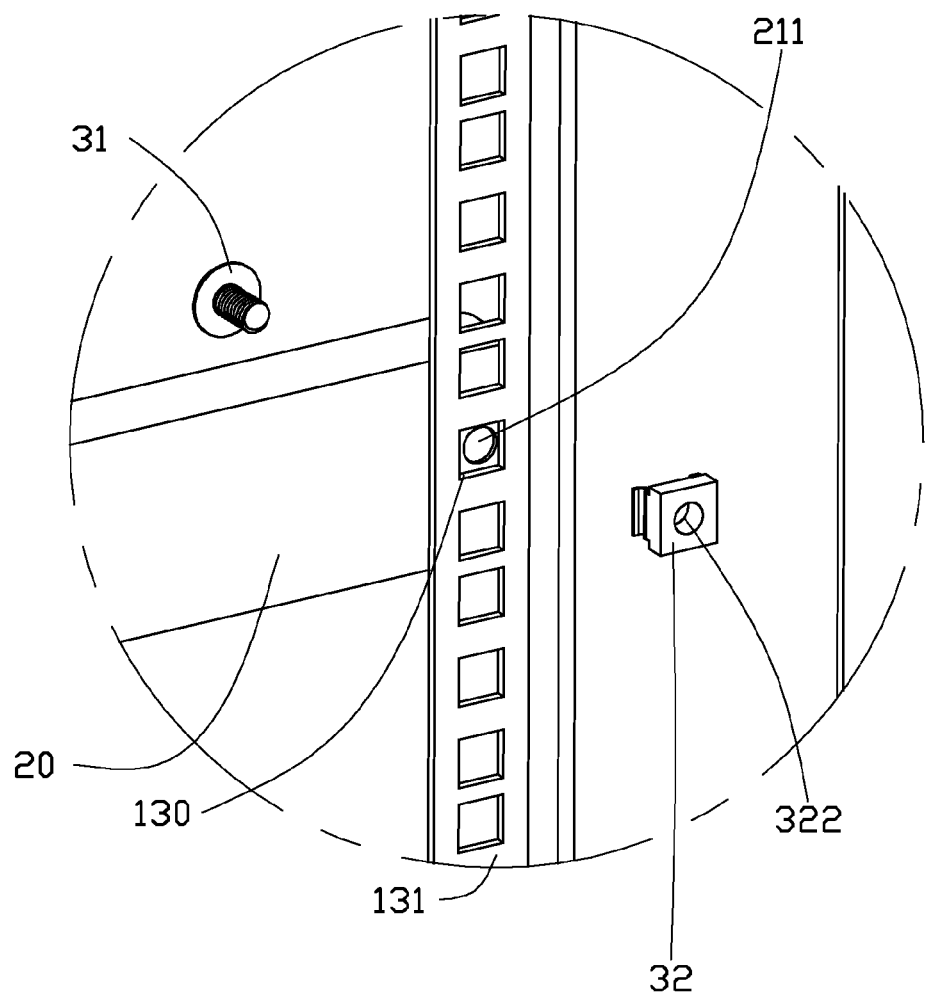
FIG. 4 is an enlarged view of the encircled portion IV of FIG. 3.

Referring to FIGS. 3 and 4, one of the mounting brackets 20 is fixed between the support posts 13a and 13c. The base plate 21 of the mounting bracket 20 abuts against inner sides of the side attachment flanges 131 of the support posts 13a and 13c, with the first fixing holes 211 of the base plate 21 aligning with the corresponding positioning holes 130 of the side attachment flanges 131. The abutting blocks 32 of two of the fasteners 30 are attached to outsides of the side attachment flanges 131 of the support posts 13a and 13c, with the threaded holes 332 of the fasteners 30 respectively aligning with the first fixing holes 211 of the mounting bracket 20. The screws 31 of the fasteners 30 respectively extend through the first fixing holes 211 and the corresponding positioning holes 130, and are fastened in the threaded holes 332 of the corresponding abutting blocks 32. In a similar way described above, the other mounting bracket 20 is fixed between the support posts 13b and 13d. Therefore, the mounting brackets 20 are mounted to the rack frame 10 at a first assembly position to support the server unit 800 sliding into the rack frame 10 through the access 102.

Figure 5:
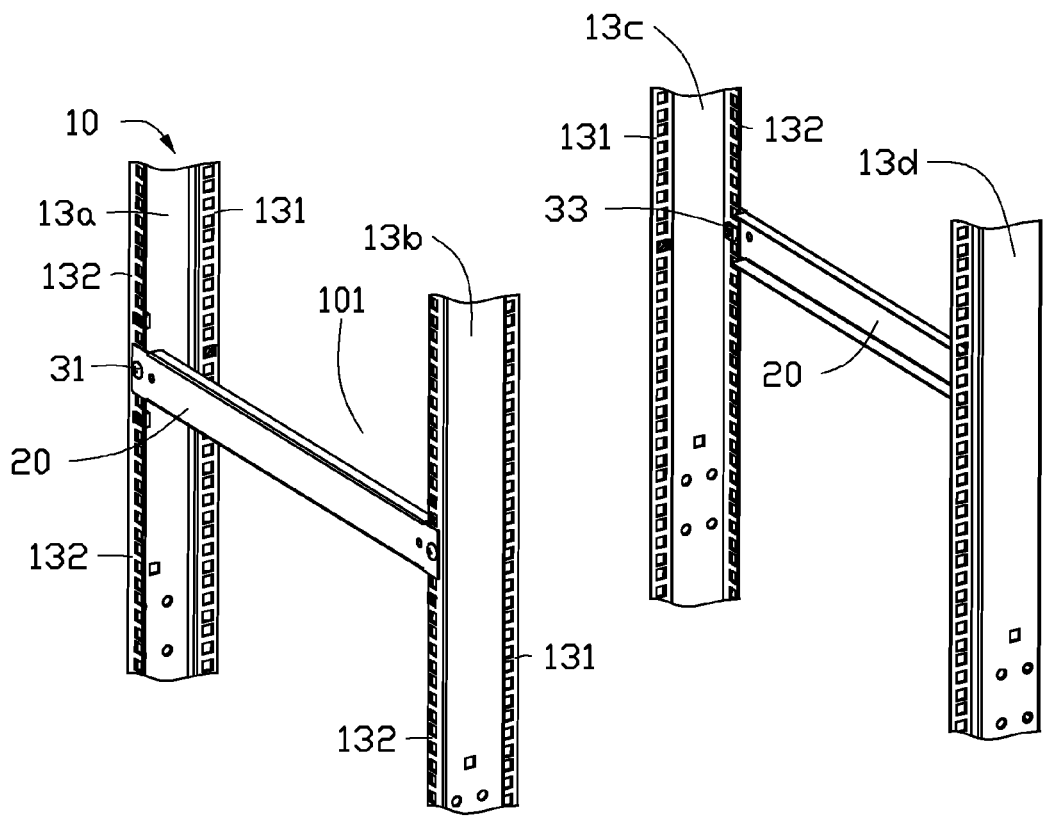
FIG. 5 is an isometric, assembled view of the server rack of FIG. 1, showing the mounting brackets at a second assembly position.

Referring to FIG. 5, after the server unit 800 is removed from the rack frame 10, one of the mounting brackets 20 is fixed between the support posts 13a and 13b to shield the access 102. The base plate 21 of the mounting bracket 20 abuts against the outsides of the end attachment flanges 132 of the support posts 13a and 13c, with the second fixing holes 212 of the base plate 21 respectively aligning with the corresponding positioning holes 130 of the end attachment flanges 132. The abutting blocks 32 of two of the fasteners 30 are attached to inner sides of the end attachment flanges 132, with the threaded holes 332 of the fasteners 30 respectively aligning with the second fixing holes 212 of the mounting bracket 20. The screws 31 of the fasteners 30 respectively extend through the second fixing holes 212 and the corresponding positioning holes 130, and are fastened in the threaded holes 332 of the corresponding abutting blocks 32. In a similar way described above, the other mounting bracket 20 is fixed between the support posts 13c and 13d, and is parallel to the mounting bracket 20 between the support post 13a and 13b. Therefore, the mounting brackets 20 are mounted to the rack frame 10 at a second assembly position to prevent air from flowing through the rack frame 10 through the access 102 to decrease heat dissipation efficiency.

It is to be understood, however, that even though numerous characteristics and advantages of the embodiment have been set forth in the foregoing description, together with details of the structure and function of the embodiment, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A server rack for mounting a server unit, comprising:
a rack frame comprising a first support post, a second support post, a third support post, and a fourth support post cooperatively bounding a rectangular space for accommodating the server unit, wherein the first and second support posts are arranged in front of the third and fourth support posts, and respectively array with the third and forth support posts and along a lengthwise direction of the rack frame, the first and third support posts respectively array with the second and fourth support posts in a transverse direction of the rack frame, an access is defined between the first and second support posts through which the server unit slides into or out of the rack frame;
two mounting brackets mounted to the rack frame selectively at a first assembly position, where one of the mounting brackets is fixed between the first and third support posts, and the other mounting bracket is fixed between the second and fourth support posts, to support the server unit, or at a second assembly position, where one of the mounting brackets is fixed between the first and second support posts to cover the access, and the other mounting bracket is fixed between the third and fourth support posts, in response to the server unit being not received in the rack frame, and
four fasteners to fix the mounting brackets to the rack frame;
wherein each of the fasteners comprises a screw and an abutting block defining a threaded hole;
each of the first to fourth support posts comprises a side attachment flange parallel to the lengthwise direction of the rack frame, and an end attachment flange parallel to the transverse direction of the rack frame, each of the side attachment flanges and the end attachment flanges defines a positioning hole;
each of the mounting brackets defines two first fixing holes respectively adjacent to opposite ends of the mounting bracket, and two second fixing holes respectively adjacent to the two first fixing holes;
the first fixing holes of the mounting brackets align with the positioning holes of the corresponding side attachment flanges to enable the screws of the corresponding fasteners to extend through the first fixing holes and the corresponding positioning holes, and to be fastened in the threaded holes of the abutting blocks, in response to the mounting brackets being at the first position; and
the second fixing holes of the mounting brackets align with the positioning holes of the corresponding end attachment flanges to enable the screws of the corresponding fasteners to extend through the second fixing holes and the corresponding positioning holes, and to be fastened in the threaded holes of the abutting blocks, in response to the mounting brackets being at the second position wherein the first fixing holes of each of the mounting brackets are arranged between the second fixing holes of the mounting brackets; wherein each of the mounting brackets includes a rectangular base plate, and two side plates respectively perpendicularly extending from opposite sides of the base plate, the first fixing holes and the second fixing holes are defined in the base plate.

* * * * *